(12) United States Patent
Valencia et al.

(10) Patent No.: US 10,892,745 B2
(45) Date of Patent: Jan. 12, 2021

(54) SIGNAL DETECTOR FOR GPON OPTICAL LINE TERMINAL

(71) Applicant: Semtech Corporation, Camarillo, CA (US)

(72) Inventors: Miguel Valencia, Bristol (GB); Guang Yang, Bristol (GB)

(73) Assignee: Semtech Corporation, Camarillo, CA (US)

( * ) Notice: Subject to any disclaimer, the term of this patent is extended or adjusted under 35 U.S.C. 154(b) by 0 days.

(21) Appl. No.: 16/374,489

(22) Filed: Apr. 3, 2019

(65) Prior Publication Data

US 2020/0321951 A1 Oct. 8, 2020

(51) Int. Cl.
*H03K 5/19* (2006.01)
*H04Q 11/00* (2006.01)
*H04B 10/69* (2013.01)

(52) U.S. Cl.
CPC ............ *H03K 5/19* (2013.01); *H04B 10/695* (2013.01); *H04Q 11/0067* (2013.01)

(58) Field of Classification Search
CPC ..... H03K 5/19; H04B 10/695; H04Q 11/0067
USPC ................................................... 327/18, 20
See application file for complete search history.

(56) References Cited

U.S. PATENT DOCUMENTS

| | | | | |
|---|---|---|---|---|
| 4,679,193 A | * | 7/1987 | Jensen | H04L 12/413 370/230 |
| 7,257,323 B2 | * | 8/2007 | Noguchi | H03K 5/086 327/18 |
| 7,705,648 B1 | | 4/2010 | Fung | |
| 8,861,584 B2 | | 10/2014 | Brown et al. | |
| 2004/0208508 A1 | * | 10/2004 | Tanaka | H04B 10/695 398/19 |
| 2006/0076941 A1 | | 4/2006 | Ishii | |
| 2007/0036541 A1 | * | 2/2007 | Tanaka | H04B 10/66 398/1 |
| 2012/0002779 A1 | * | 1/2012 | Shimada | H03K 21/38 377/39 |
| 2017/0041006 A1 | | 2/2017 | Uezato | |

* cited by examiner

*Primary Examiner* — William Hernandez
(74) *Attorney, Agent, or Firm* — Robert D. Atkins; Patent Law Group: Atkins and Associates, P.C.

(57) ABSTRACT

A circuit detects a digital pattern with a first counter having an input receiving a digital pattern, and an output providing an output signal after detecting a first number of pulses during a first time period. A latch has an input coupled to the output of the first counter for latching the output signal of the first counter. A second counter has an input receiving the digital pattern, and an output providing an output signal after detecting a second number of pulses during a second time period. A logic gate has a first input coupled the output of the first counter, and a second input coupled to the output of the second counter, and an output coupled to the input of the latch. An amplitude detection circuit has an input coupled for receiving the digital pattern and an output coupled to the input of the first counter.

23 Claims, 8 Drawing Sheets

SIGNAL DETECTOR FOR GPON OPTICAL LINE TERMINAL

FIELD OF THE INVENTION

The present invention relates in general to a passive optical network and, more particularly, to a signal detector for a GPON optical line terminal.

BACKGROUND OF THE INVENTION

A gigabit passive optical network (GPON) provides high speed data communications, over a fiber optical cable, between an internet service provider (ISP) and end user. A GPON uses point-to-multipoint architecture (1:32) with a fiber optic splitter to serve multiple end-points from a single optical source. For example, the GPON includes an optical line terminal (OLT) at the ISP central office or switching center and a plurality of optical network units (ONU) or optical network terminals (ONT) located near the end users. Each ONU serves an individual end user. A GPON reduces the amount of fiber and central office equipment as compared with other networks since unpowered fiber optic splitters are used to enable a single optical fiber to serve multiple end-points.

The GPON is a shared network, in that the OLT sends a stream of data packets as downstream traffic that is seen by all ONUs. The downstream signals are broadcast from the OLT transmitter to all ONUs in continuous mode (CM). Each ONU reads the content of the data packets that correspond to the particular ONU address. Encryption prevents eavesdropping on downstream traffic. However, in the upstream channel, the ONU typically cannot transmit the optical data signal in CM, because there are more ONUs than OLTs and the receive timing of the optical data signal is variable. Instead, signals are combined using a multiple access protocol, such time division multiple access (TDMA). Therefore, a given ONU transmits an optical packet in an assigned time slot using burst mode (BM) transmission. All ONUs use the same clock frequency as the OLT as they extract the frequency from the downstream channel by using a clock and data recovery (CDR) circuit.

Many ONUs are geographically dispersed and operate at least partially out-of-phase because of the distance and delay to the OLT. The optical signals from different ONUs also experience different attenuation. Accordingly, the OLT receives BM optical packages from different ONUs that are asynchronous, out-of-phase, and with different amplitudes. The OLT must identify the preamble of the burst mode transmission. The OLT can then compensate for signal degradation from the phase and amplitude variation of the optical signal.

In the prior art, the preamble of the burst mode transmission has been identified by measuring the time between two consecutive edges, see U.S. Pat. No. 8,861,584. Every edge in the receive signal must occur at a specific time in order to detect a valid preamble. The timing and measurements are precise and require time critical circuitry in order to determine when the edges need to occur. A simpler, more cost effective design would be preferred.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, those skilled in the art will appreciate that the description is intended to cover alternatives, modifications, and equivalents as may be included within the spirit and scope of the invention as defined by the appended claims and the claims' equivalents as supported by the following disclosure and drawings.

Figure 1:
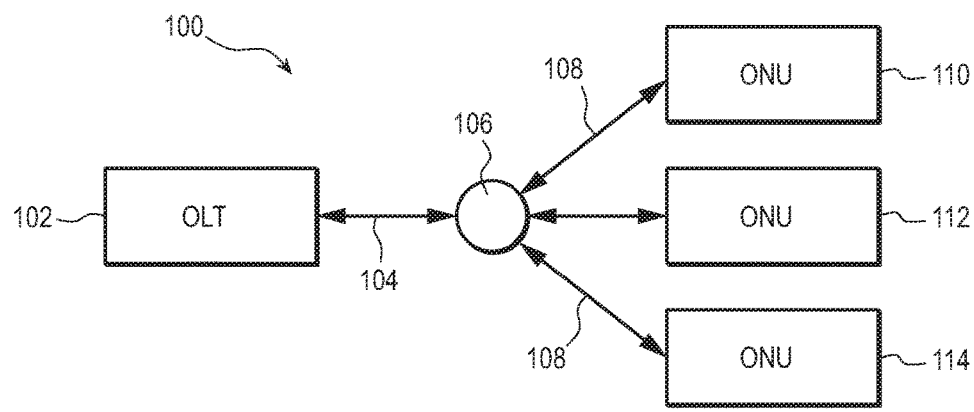
FIG. 1 illustrates a gigabit passive optical network with OLT, optical splitter, and a plurality of ONUs.

FIG. 1 illustrates GPON 100 providing high speed data communications, over fiber optical cable, between an ISP and end users. GPON 100 includes OLT 102 located within the ISP home office or switching center. OLT 102 makes connection with the internet. OLT 102 is coupled through fiber optical cable 104 to optical splitter 106, which provides multiple optical signal paths through fiber optical cables 108 to ONU 110, 112, and 114 located near end users. In one embodiment, optical splitter 106 connects up to 32 ONUs and brings optical fiber cabling and signals to the end user.

GPON 100 is a shared network, in that OLT 102 sends a stream of data packets as downstream traffic through fiber optical cables 104 and 108 to ONU 110-114. Each ONU 110-114 reads the content of the data packets that correspond to the particular ONU address. Encryption prevents eavesdropping on downstream traffic. In the upstream channel, the ONU transmits the optical data signal using a multiple access protocol, such TDMA. A given ONU transmits an optical packet in an assigned time slot using BM transmission. All ONUs use the same clock frequency as the OLT as they extract the frequency from the downstream channel by using a CDR circuit.

The present invention is also applicable to gigabit ethernet passive optical network (GEPON), EPON, 10G-EPON, XGPON, XGSPON, 25G-EPON, 50G-EPON, and other burst PON applications for sending data packets.

Figure 2:
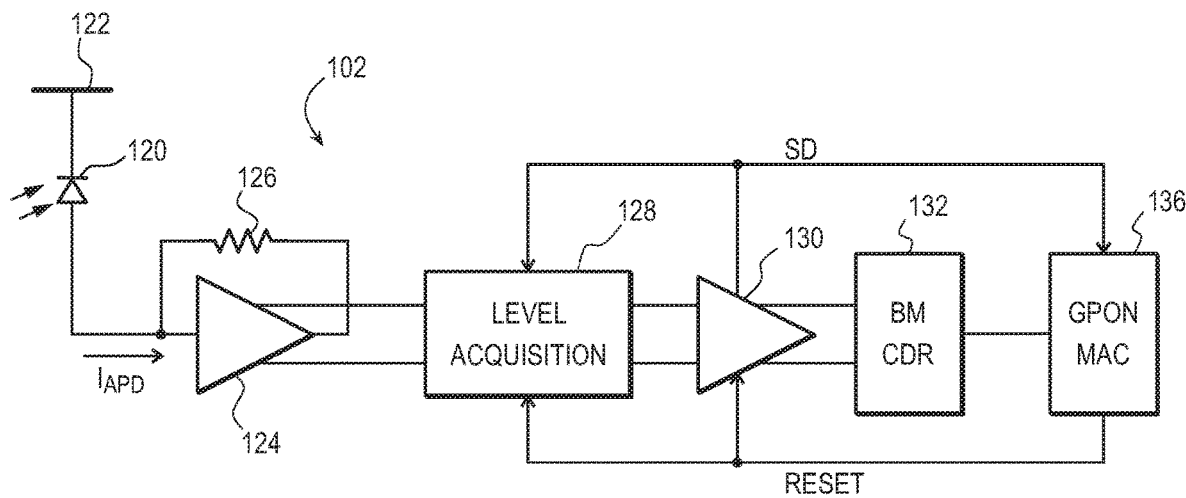
FIG. 2 illustrates further detail of the OLT of the GPON.

FIG. 2 illustrates further detail of the receiver portion of OLT 102, i.e., receiving the upstream optical data signal in bursts from ONU 110-114. Components of the receiver portion of OLT 102 are contained in one or more semiconductor devices. Avalanche photodiode (APD) 120 detects the upstream optical data signal from ONU 110-114. The cathode of APD 120 is coupled to a positive power supply conductor 122, and the anode is coupled to an input of burst mode (BM) transimpedance amplifier (TIA) 124. APD 120 converts the optical data signal to current $I_{APD}$. BM TIA 124 converts $I_{APD}$ to a voltage representative of the received optical data signal, and resistor 126 sets the gain of BM TIA 124. The differential output of BM TIA 124 is coupled to a differential input of level acquisition circuit 128. The differential output of level acquisition circuit 128 is coupled to a differential input of BM limiting amplifier (LIA) 130, and the differential output of BM LIA 130 is coupled to a differential input of BM clock and data recovery (CDR) 132. GPON medium access control (MAC) 136 controls the communication between downstream data and upstream data. GPON MAC 136 generates RESET at the end (or at the beginning) of each burst cycle to reset level acquisition circuit 128 and BM LIA 130.

Figure 3:
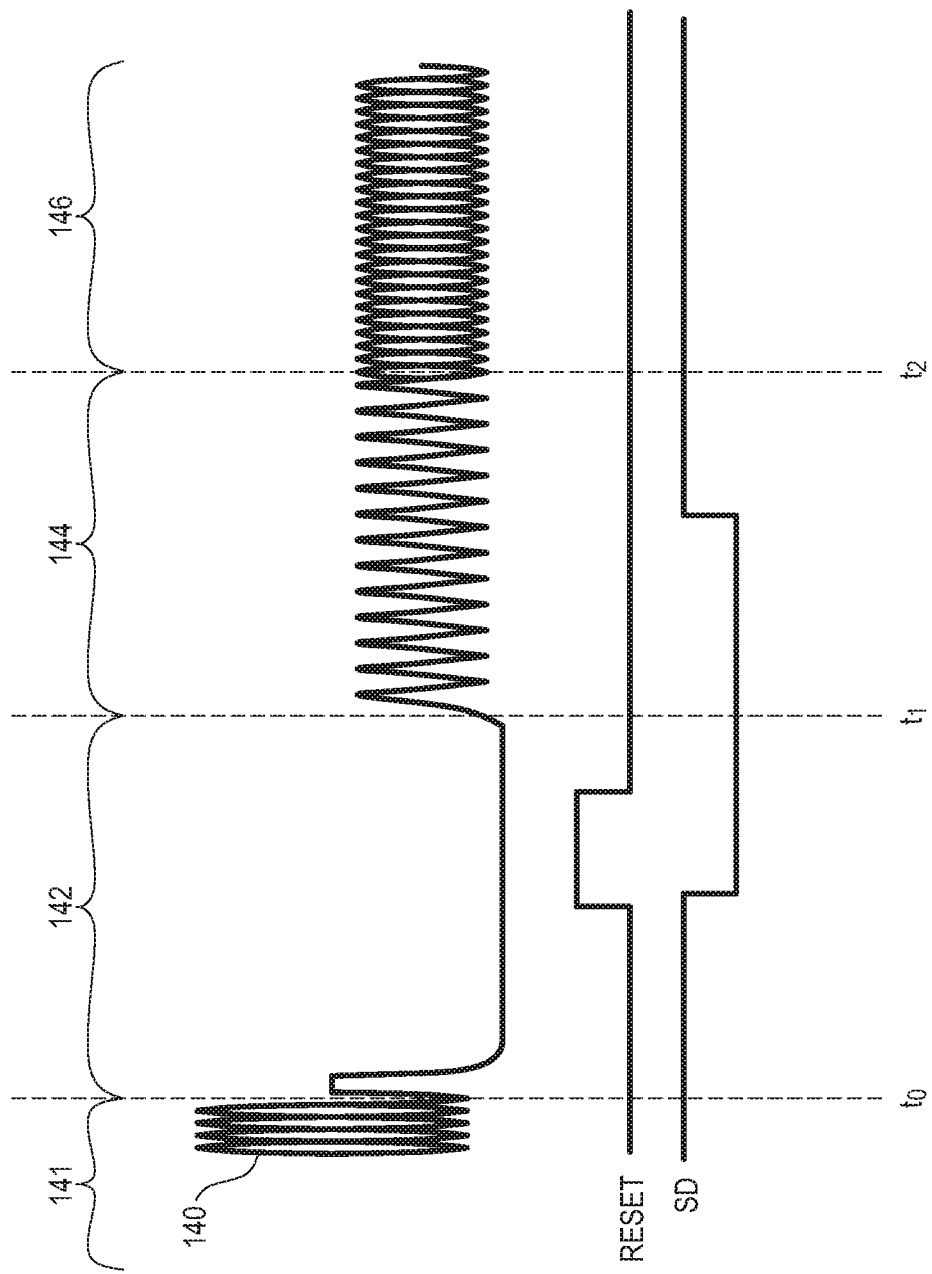
FIG. 3 illustrates a timing diagram of a received data signal and control signals.

An upstream data signal 140 is received by APD 120 of OLT 102 in FIG. 3. Time $t_0$ marks the end of a previous burst cycle 141. Guard interval 142 ensures that ONUs 110-114 do not interfere with one another, or otherwise cause overlapping transmissions. During guard interval 142, GPON MAC 136 generates RESET to prepare for processing the next burst of data. The incoming burst of data has an unknown amplitude that must be accommodated or compensated for. BM LIA 130 next asserts signal detect (SD) during guard interval 142 to confirm to GPON MAC 136 and level acquisition circuit 128 that data signal 140 is present and valid. Preamble 144 begins at time $t_1$ with a sequence of a one optical level followed by a zero optical level. BM TIA 124 and BM LIA 130 use the time period of preamble 144 to compensate for amplitude variation of data signal 140, and for BM CDR 132 to phase-align with the transmitting ONU. Signal detect SD is asserted during preamble 144. The next data burst 146 begins at time $t_2$. Guard time 142 and preamble 144 represent overhead of the communication protocol and should be short in duration, e.g., 25.7 nanosecond (ns) guard time and 35.4 ns preamble at 1.2 Gbps.

BM TIA 124 handles a wide range of amplitude variations in data burst 146, i.e., the amplitude of the data signal may be high or low. In the ideal case, the differential output signal of BM TIA 124 is symmetrical about a reference signal. The reference level is the middle of the differential output signal. There should be no DC offset of the differential signal with respect to the reference signal. However, the optical signal from ONU 110 may be attenuated more or less than the optical signal from ONU 112 or 114. Accordingly, the optical signal from ONU 110 may have an amplitude greater than or less than the optical signal from ONU 112 or 114. Note that data burst 141 has a greater amplitude as compared to data burst 146. Due to such system variation, e.g., changes in optical signal amplitude during a burst, and changes in optical signal amplitude from one burst to another burst, as well as variations in delay from ONU 110-114 to OLT 102, the differential output signal of BM TIA 124 may have a non-zero DC offset with respect to the reference signal that is proportional to the amplitude of the input optical signal. Level acquisition circuit 128 creates a dynamic time constant for each burst cycle to remove or compensate for the DC offset from the differential signal from BM TIA 124. Under present design standards, there is a short time to remove the DC offset. Level acquisition circuit 128 is described in detail in U.S. application Ser. No. 16/271,824, entitled "Dynamic Time Constant for Quick Decision Level Acquisition", which is incorporated herein by reference.

Figure 4:
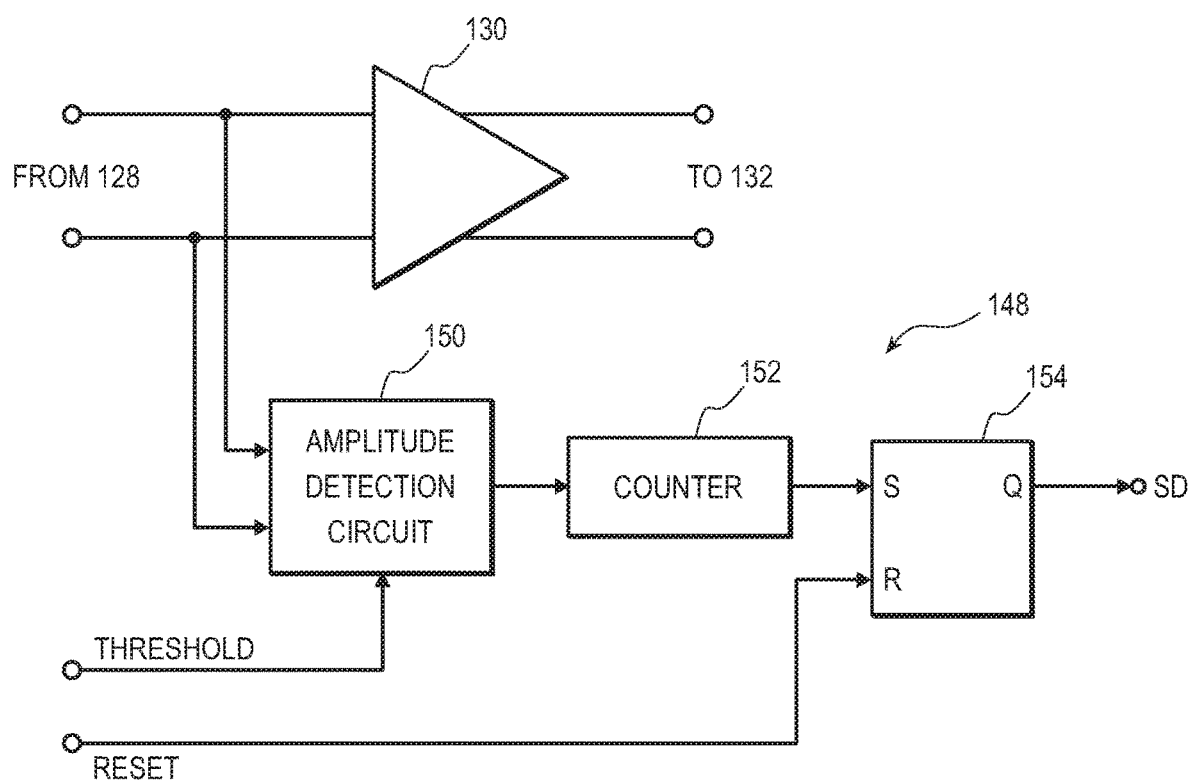
FIG. 4 illustrates further detail of the BM LIA and signal detection circuit in the OLT.

FIG. 4 illustrates further detail of BM LIA 130 and detection circuitry 148 for generated signal detect SD. Signal detect SD is asserted when preamble 144 is confirmed to be valid. The differential output of level acquisition circuit 128 is also coupled to amplitude detection circuit 150. In particular, circuit 150 uses an amplitude detection circuit to confirm that an amplitude of data signal 140 is above a threshold value. A threshold signal is applied to amplitude detection circuit 150. The threshold value is typically set to detect the minimum amplitude for data signal 140, 146 to meet an error rate, which is typically lower than one bit in 1e10 bits. Amplitude detection circuit 150 is described in detail in U.S. application Ser. No. 16/401,107, entitled "Signal Detection for GPON Optical Line Terminal", which is incorporated herein by reference. If the amplitude of data signal 140 is above the threshold, the output of amplitude detection circuit 150 provides preamble 144 pulses to digital counter 152 to confirm the known and proper predetermined pattern of the preamble, see discussion below. The output of counter 152 is coupled to a set (S) input of flipflop 154. The reset (R) input of flipflop 154 receives the RESET signal, and the output (Q) of flipflop 154 provides signal detect SD.

Signal detect SD goes to a logic zero state (non-asserted) at reset, see FIG. 3 between times $t_0$ and $t_1$. Once signal detect SD is asserted, BM CDR 132 confirms to GPON MAC 136 and level acquisition circuit 128 that preamble 144 is present and valid to begin phase acquisition. Amplitude detection circuit 150 must sense small signals (<5 millivolts) due to the network attenuation (>28 dB). The detection and confirmation of a valid data signal 140 must occur quickly to minimize the length of preamble 144. Signal detect SD asserts as soon as possible after the burst cycle arrives in order to keep a minimum duration of preamble 144, while allowing sufficient time for BM CDR 132 to phase lock to data signal 140. Amplitude detection circuit 150 requires a large gain-bandwidth product (GBWP) to detect small signals. However, the high GBWP amplitude detection circuit 150 is sensitive to noise originating from APD 120, BM TIA 124, and resistor 126. The noise can undesirably trigger amplitude detection circuit 150, creating a false trigger that unintentionally asserts signal detect SD. GPON MAC 136 would likely identify the false trigger and reset the receiver portion of OLT 102 but not before potentially missing data as a result of the false trigger. One or more ONUs could be transmitting data when OLT 120 was not properly phase locked and ready to receive data signal 140.

Figure 5A:
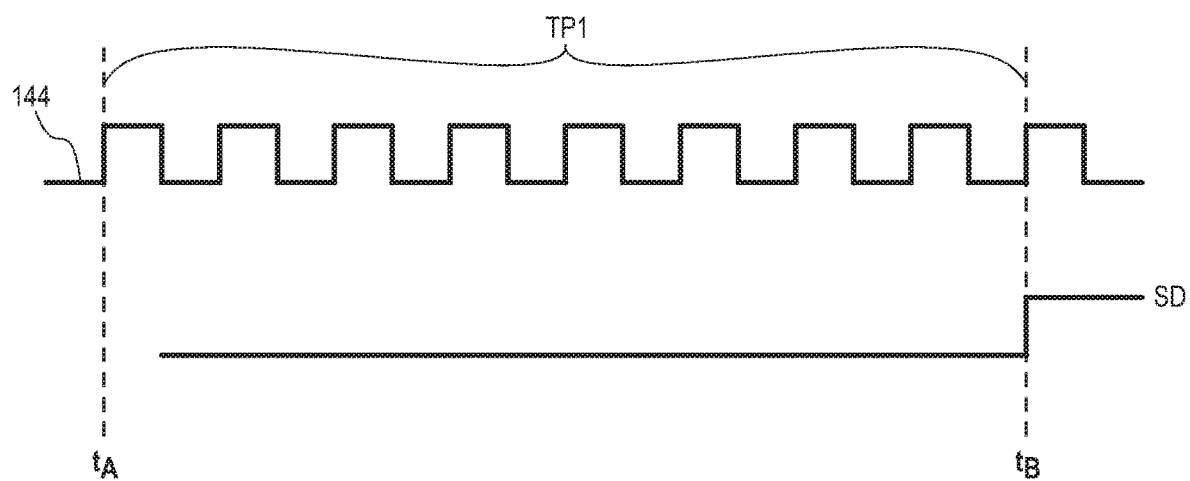
FIGS. 5a-5b illustrate timing diagram of the preamble in the burst mode transmission and signal detect in FIG. 4.

Preamble 144 contains a digital pattern of alternating logic one and logic zero in the form "1010101 . . . ". The expected pattern is a square wave signal of frequency half the data rate (1.244 Gbits to 622 Mhz), the number of edges in a specific interval is predetermined and known. Digital counter 152 counts the number of edges of the received pattern within a time period TP1 to determine whether the received pattern is the known proper and expected preamble. FIG. 5*a* shows preamble 144 and signal detect SD. RESET sets the Q output of flipflop 154 and signal detect SD to logic zero. Digital counter 152 counts 9 rising edges (or falling edges) of preamble 144 from amplitude detection circuit 150 during TP1, which is the known proper pattern configured for the counter. The known and expected predetermined number of pulses for counter 152 during TP1 can be stored in a register or memory block. The output of counter 152 goes to logic one to set flipflop 154 after detecting the known proper pattern of 9 rising edges during TP1. The Q output of flipflop 154 goes to logic one to assert signal detect SD.

Figure 5B:
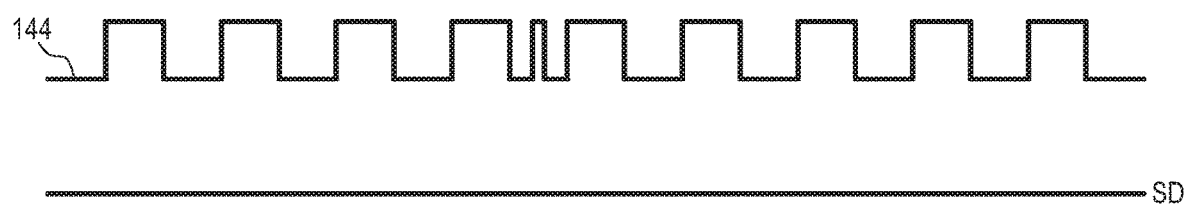

FIG. 5*b* shows another pattern preamble 144 and signal detect SD. Digital counter 152 counts 10 rising edges of preamble 144 during TP1, which is an improper pattern (see spurious logic one pulse in FIG. 5*b*). The output of counter 152 remains logic zero after detecting the improper pattern of 10 rising edges during TP1. Flipflop 154 is not set and the Q output of flipflop 154 and signal detect SD remain non-asserted logic zero, i.e., no signal detect SD trigger.

By comparing the expected count to the actual count, the pattern of preamble 144 can be determined whether nor not the digital pattern is known and proper to trigger signal detect SD. If the start of TP1 is synchronous with the rising or falling edges of preamble 144, then counter value must be equal to the expected number of edges. If the start of TP1 is asynchronous with the rising or falling edges of preamble 144, the counter value must be equal to the expected number of edges or to the expected number of edges minus 1.

Figure 6:
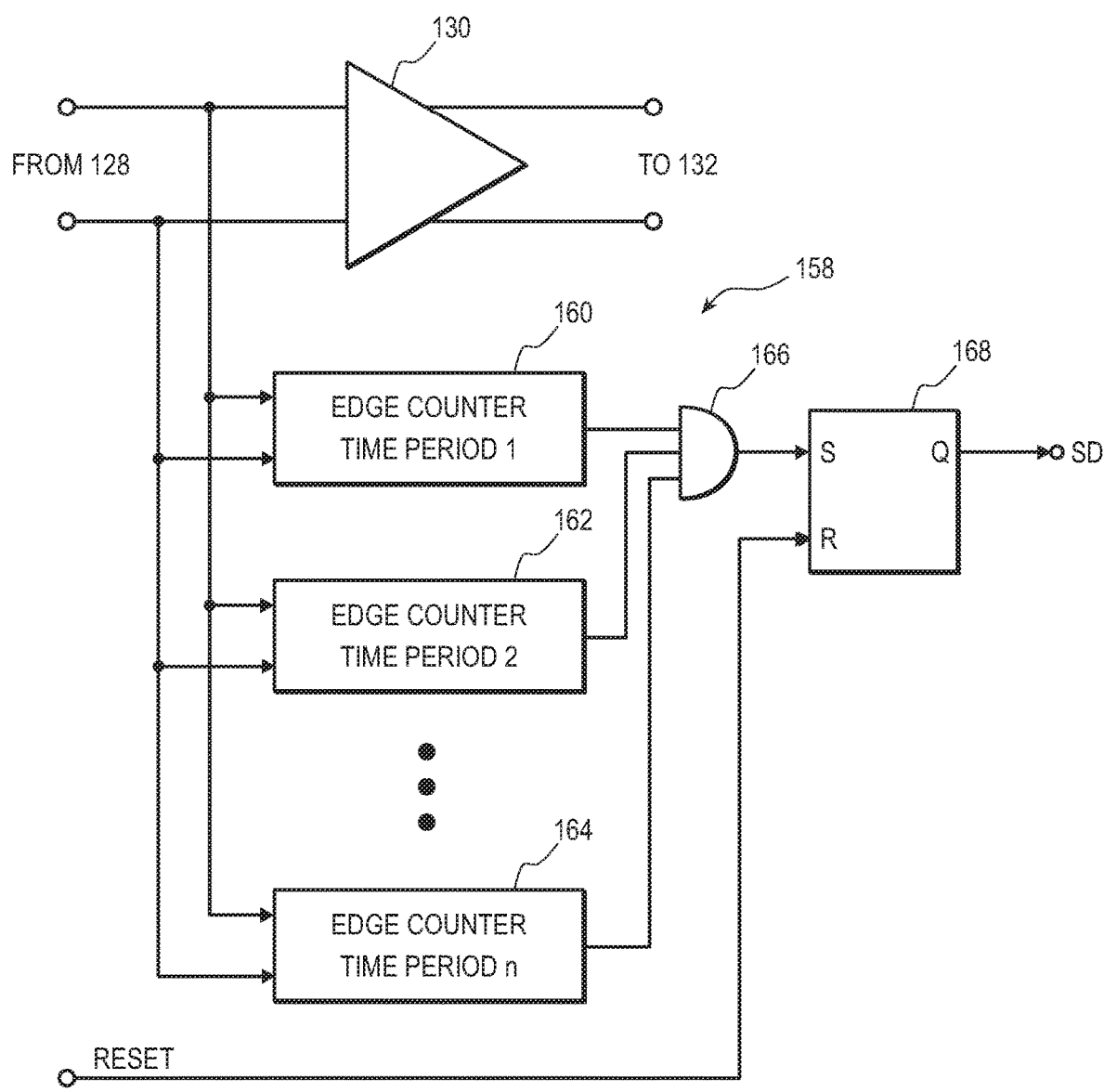
FIG. 6 illustrates another embodiment of the BM LIA and signal detection circuit in the OLT.

In practice, there are typically hundreds of preamble pulses during TP1, e.g., 1.0 gigabit data signal 140 over 1.0 microsecond yields 500 rising edges. In some applications, counting 500 rising edges can be excessive or at least more than necessary to confirm the digital pattern. FIG. 6 shows another embodiment of BM LIA 130 and detection circuitry 158 for generated signal detect SD. The differential output of level acquisition circuit 128 is coupled to digital counter 160, digital counter 162, and digital counter 164. Each counter monitors a different portion of TP1. For example, digital counter 160 monitors time portion TP1A, digital counter 162 monitors time portion TP1B, and digital counter 164 monitors time portion TP1C. Time portions TP1A, TP1B, and TP1C run consecutively. TP1 can be divided into any number of portions N. There would be N counters for N portions of TP1 to confirm the known and proper pattern of preamble 144. The output of counter 160-164 are coupled to inputs of AND gate 166. The output of AND gate 166 is coupled to a set (S) input of flipflop 168. The reset (R) input of flipflop 168 receives the RESET signal, and the output (Q) of flipflop 168 provides signal detect SD.

Figure 7A:
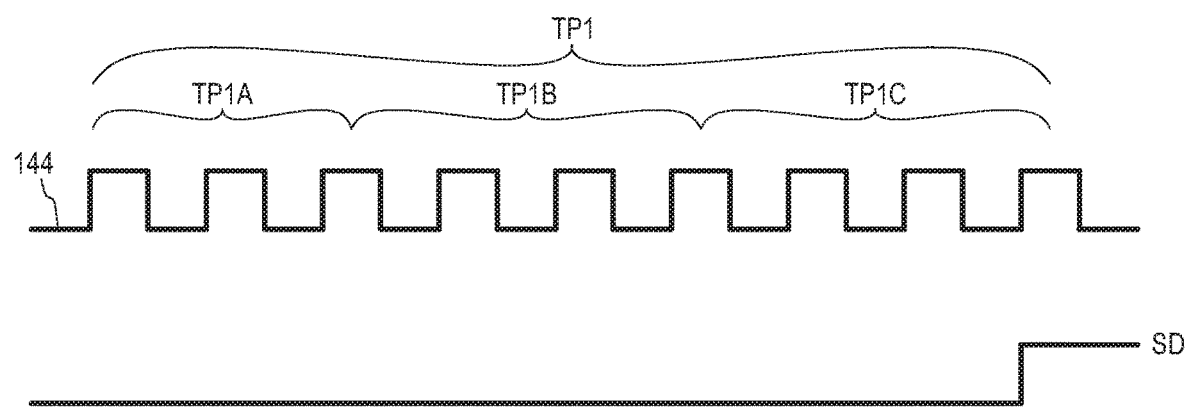
FIGS. 7a-7b illustrate timing diagram of the preamble in the burst mode transmission and signal detect in FIG. 4.

Again, preamble 144 contains a digital pattern of alternating logic one and logic zero in the form "1010101 . . . ". FIG. 7a shows preamble 144 and signal detect SD. RESET sets the Q output of flipflop 168 and signal detect SD to logic zero. Digital counter 160 counts 3 rising edges (or falling edges) of preamble 144 during TP1A, which is the known proper portion of the pattern configured for the counter. The output of counter 160 goes to logic one. Digital counter 162 counts 3 rising edges (or falling edges) of preamble 144 during TP1B, which is the known proper portion of the pattern configured for the counter. The output of counter 162 goes to logic one. Digital counter 164 counts 3 rising edges (or falling edges) of preamble 144 during TP1C, which is the known proper portion of the pattern configured for the counter. The output of counter 164 goes to logic one. The known and expected predetermined number of pulses for counters 160-164 during TP1A, TP1B, and TP1C can be stored in a register or memory block. AND gate 166 receives three logic ones and provides an output logic one to set flipflop 168 after detecting the known proper pattern of 9 rising edges during TP1 (3 rising edges during each of TP1A, TP1B, and TP1C). The Q output of flipflop 168 goes to logic one to assert signal detect SD.

Figure 7B:
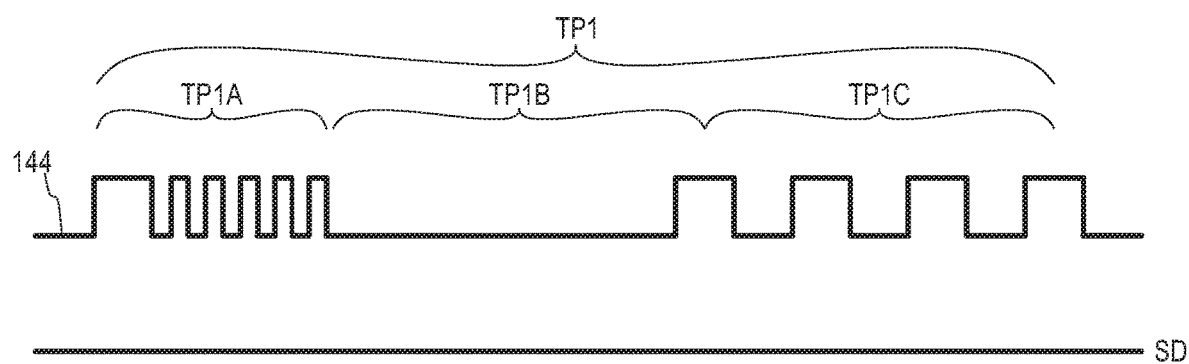

FIG. 7b shows another pattern preamble 144 and signal detect SD. Digital counter 160 counts 6 rising edges (or falling edges) of preamble 144 during TP1A, which does not match the expected count. The output of counter 162 remains logic zero. Digital counter 162 counts 1 rising edge (or falling edge) of preamble 144 during TP1B, which does not match the expected count. The output of counter 162 remains logic zero. Digital counter 164 counts 3 rising edges (or falling edges) of preamble 144 during TP1C, which is the known proper portion of the pattern configured for the counter. The output of counter 164 goes to logic one. AND gate 166 receives two logic zeroes and one logic one and provides an output logic zero after detecting the improper pattern of rising edges collectively over TP1. Flipflop 168 is not set and the Q output of flipflop 168 and signal detect SD remain non-asserted logic zero, i.e., no signal detect SD trigger.

Notably, digital counter 152 would have detected 9 rising edges during TP1 for the given pattern of FIG. 7b and asserted signal detect SD as logic one. Accordingly, multiple counters 160-164 can reduce occurrences of false signal detect SD.

Figure 8:
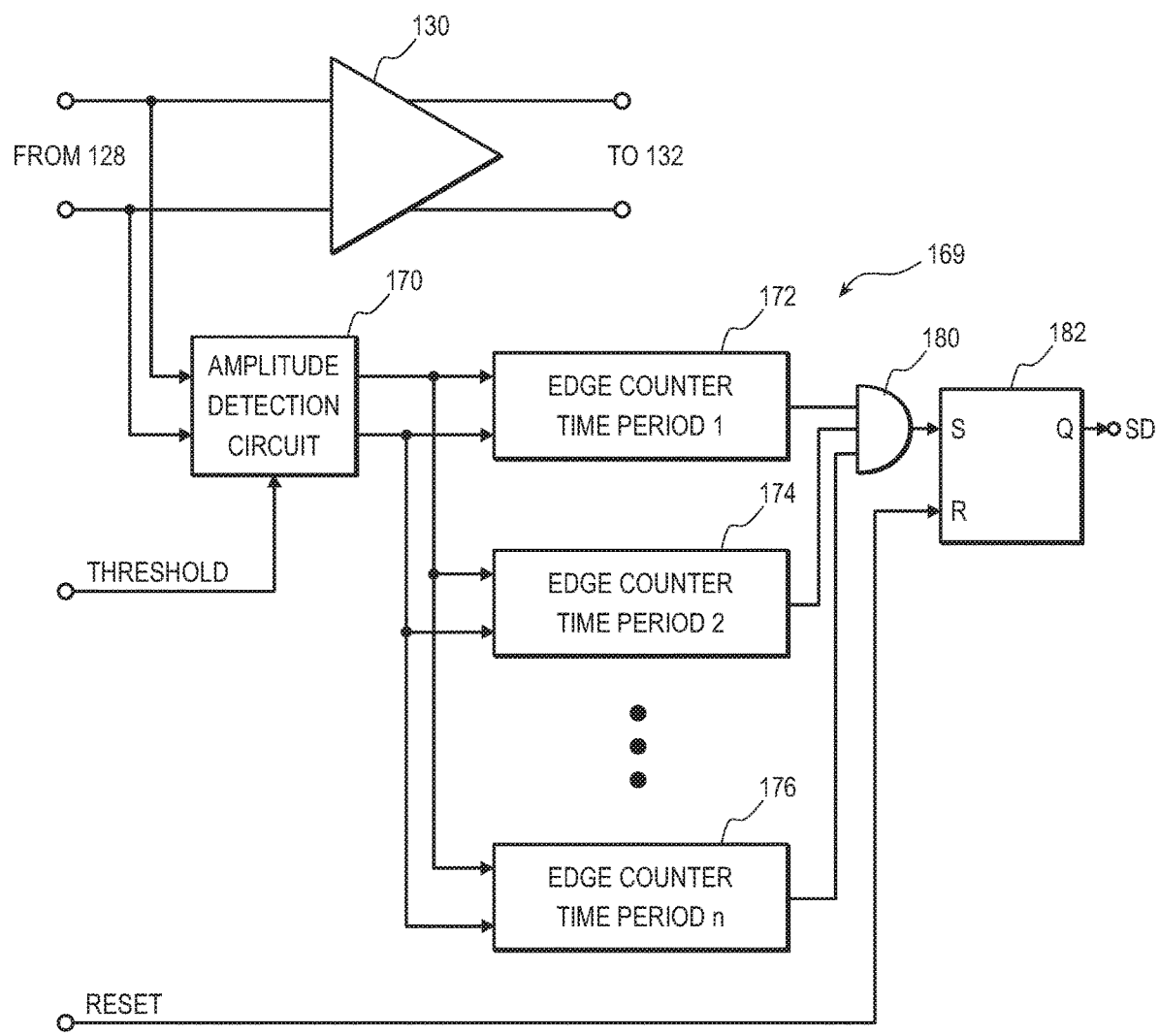
FIG. 8 illustrates another embodiment of the BM LIA and signal detection circuit in the OLT.

FIG. 8 shows another embodiment of BM LIA 130 and detection circuitry 169 for generated signal detect SD. The differential output of level acquisition circuit 128 is coupled to amplitude detection circuit 170. In particular, circuit 170 uses an amplitude detection circuit to confirm that an amplitude of data signal 140 is above a threshold value. A threshold signal is applied to amplitude detection circuit 170. The threshold value is typically set midway in the minimum to maximum range of amplitude for data signal 140. If the amplitude of data signal 140 is above the threshold, the output of amplitude detection circuit 170 provides preamble 144 pulses to digital counter 172, digital counter 174, and digital counter 176. Each counter monitors a different portion of TP1. For example, digital counter 172 monitors time portion TP1A, digital counter 174 monitors time portion TP1B, and digital counter 176 monitors time portion TP1C. Note that time portion TP1A and time portion TP1B overlap, and time portion TP1B and time portion TP1C overlap. TP1 can be divided into any number of portions N. There would be N counters for N portions of TP1 to confirm the known and proper pattern of preamble 144. The output of counter 172-176 are coupled to inputs of AND gate 180. The output of AND gate 180 is coupled to a set (S) input of flipflop 182. The reset (R) input of flipflop 182 receives the RESET signal, and the output (Q) of flipflop 182 provides signal detect SD.

Figure 9A:
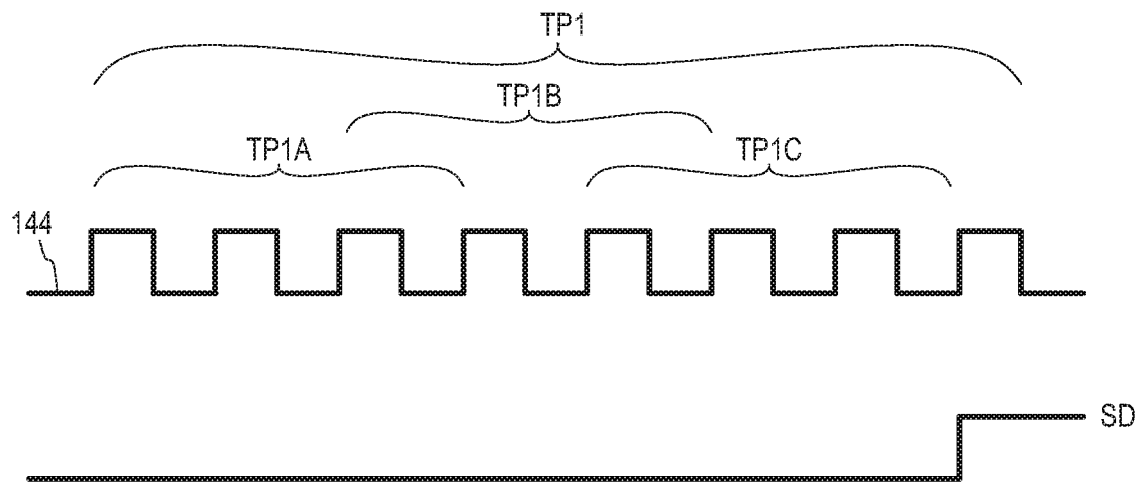
FIGS. 9a-9b illustrate timing diagram of the preamble in the burst mode transmission and signal detect in FIG. 8.

Again, preamble 144 contains a digital pattern of alternating logic one and logic zero in the form "1010101 . . . ". FIG. 9a shows preamble 144 and signal detect SD. RESET sets the Q output of flipflop 182 and signal detect SD to logic zero. Digital counter 172 counts 4 rising edges (or falling edges) of preamble 144 during TP1A, which is the known proper portion of the pattern configured for the counter. The output of counter 172 goes to logic one. Digital counter 174 counts 4 rising edges (or falling edges) of preamble 144 during TP1B, which is the known proper portion of the pattern configured for the counter. Digital counters 172 and 174 are counting some of the same rising edges, i.e., the counting overlap. The output of counter 174 goes to logic one. Digital counter 176 counts 4 rising edges (or falling edges) of preamble 144 during TP1C, which is the known proper portion of the pattern configured for the counter. Digital counters 174 and 176 are counting some of the same rising edges, i.e., the counting overlap. The output of counter 176 goes to logic one. The known and expected predetermined number of pulses for counters 172-176 during TP1A, TP1B, and TP1C can be stored in a register or memory block. AND gate 180 receives three logic ones and provides an output logic one to set flipflop 182 after detecting the known proper pattern of rising edges during TP1 (4 rising edges during each of TP1A, TP1B, and TP1C). The Q output of flipflop 182 goes to logic one to assert signal detect SD.

Figure 9B:
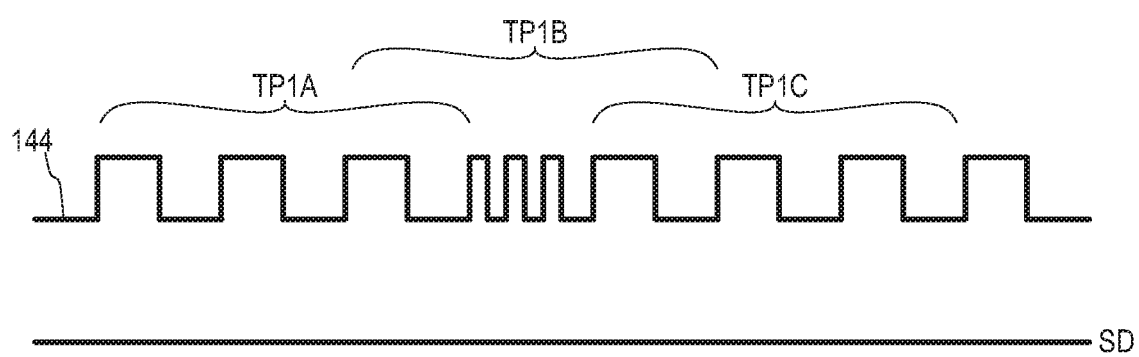

FIG. 9b shows another pattern preamble 144 and signal detect SD. Digital counter 172 counts 4 rising edges (or falling edges) of preamble 144 during TP1A, which is the known proper portion of the pattern configured for the counter. The output of counter 172 goes to logic one. Digital counter 174 counts 6 rising edges (or falling edges) of preamble 144 during TP1B, which does not match the expected count. The output of counter 174 remains logic zero. Digital counter 176 counts 4 rising edges (or falling edges) of preamble 144 during TP1C, which is the known proper portion of the pattern configured for the counter. The output of counter 176 goes to logic one. AND gate 166 receives one logic zero and two logic ones and provides an output logic zero after detecting the improper pattern of rising edges collectively over TP1. Flipflop 182 is not set and the Q output of flipflop 182 and signal detect SD remain non-asserted logic zero, i.e., no signal detect SD trigger.

In summary, detection circuitry 148, 158, 169 count a predetermined number of edges in a given time interval to confirm a valid preamble 144. The implementation of the detection circuitry is simple and requires less time critical measurements. The transition density due to noise is lower than the preamble pattern (bit error rate is less than $10\,e^{-10}$), and the probability of generating a specific number of transitions due to noise in a given time interval is low. Multiple counters reduce the probability of a false trigger. The amplitude detection circuit also reduces the probability of the false triggering since the noise amplitude needs to exceed the threshold.

While one or more embodiments of the present invention have been illustrated in detail, the skilled artisan will appreciate that modifications and adaptations to those embodiments may be made without departing from the scope of the present invention as set forth in the following claims.

What is claimed:

1. A signal detection circuit, comprising:
    an amplitude detection circuit comprising an input coupled for receiving a signal;
    a first counter including an input coupled to an output of the amplitude detection circuit, wherein the first counter provides an output signal with a first logic state after counting a first predetermined number of pulses in the signal during a first time period and otherwise provides the output signal with a second logic state; and
    a latch having an input coupled to an output of the first counter for latching the output signal of the first counter.

2. The signal detection circuit of claim 1, further including a second counter coupled for receiving the signal, wherein the second counter provides an output signal with a first logic state after counting a second predetermined number of pulses of the signal during a second time period.

3. The signal detection circuit of claim 2, further including a logic gate comprising a first input coupled to the output of the first counter, and a second input coupled to an output of the second counter, and an output coupled to the input of the latch.

4. The signal detection circuit of claim 2, wherein a portion of the first time period overlaps a portion of the second time period.

5. The signal detection circuit of claim 2, wherein the first time period is consecutive with the second time period.

6. A circuit for detecting a digital pattern of an optical signal from an optical receiving circuit, comprising:
    a first counter including an input coupled for receiving the digital pattern of the optical signal, and an output providing an output signal with a first logic state after detecting a first predetermined number of pulses of the digital pattern of the optical signal during a first time period and otherwise provides the output signal with a second logic state;
    a second counter including an input coupled for receiving the digital pattern of the optical signal, and an output providing an output signal with a first logic state after detecting a second predetermined number of pulses of the digital pattern of the optical signal during a second time period and otherwise provides the output signal with a second logic state;
    a logic gate comprising a first input coupled to the output of the first counter, and a second input coupled to the output of the second counter; and
    a latch having an input coupled to an output of the logic gate for latching an output signal of the logic gate.

7. The circuit of claim 6, wherein a portion of the first time period overlaps a portion of the second time period.

8. The circuit of claim 6, wherein the first time period is consecutive with the second time period.

9. The circuit of claim 6, further including an amplitude detection circuit comprising an input coupled for receiving the digital pattern of the optical signal and an output coupled to the input of the first counter.

10. The circuit of claim 6, wherein the digital pattern of the optical signal is a preamble of a burst mode optical transmission.

11. A method of making a semiconductor device including a circuit for detecting a digital pattern of an optical signal from an optical receiving circuit, comprising the steps of:
    providing a first counter including an input coupled for receiving a digital pattern of the optical signal, and an output providing an output signal with a first logic state after detecting a first predetermined number of pulses of the digital pattern of the optical signal during a first time period and otherwise provides the output signal with a second logic state; and
    providing a latch having an input coupled to the output of the first counter for latching the output signal of the first counter.

12. The method of claim 11, further including the step of providing a second counter including an input coupled for receiving the digital pattern of the optical signal, and an output providing an output signal with a first logic state after detecting a second predetermined number of pulses of the digital pattern of the optical signal during a second time period.

13. The method of claim 12, further including the step of providing a logic gate comprising a first input coupled to the output of the first counter, and a second input coupled to the output of the second counter, and an output coupled to the input of the latch.

14. The method of claim 12, wherein a portion of the first time period overlaps a portion of the second time period.

15. The method of claim 12, wherein the first time period is consecutive with the second time period.

16. The method of claim 11, further including the step of providing an amplitude detection circuit comprising an input coupled for receiving the digital pattern of the optical signal and an output coupled to the input of the first counter.

17. The method of claim 11, wherein the digital pattern of the optical signal is a preamble of a burst mode optical transmission.

18. A circuit for detecting a digital pattern of an optical signal from an optical receiving circuit, comprising:
    a first counter including an input coupled for receiving a digital pattern of the optical signal, and an output providing an output signal with a first logic state after detecting a first predetermined number of pulses of the digital pattern of the optical signal during a first time period and otherwise provides the output signal with a second logic state; and a latch having an input coupled to the output of the first counter for latching the output signal of the first counter.

19. The circuit of claim 18, further including a second counter including an input coupled for receiving the digital pattern of the optical signal, and an output providing an output signal with a first logic state after detecting a second predetermined number of pulses of the digital pattern of the optical signal during a second time period.

20. The circuit of claim 19, further including a logic gate comprising a first input coupled to the output of the first counter, and a second input coupled to the output of the second counter, and an output coupled to the input of the latch.

21. The circuit of claim 19, wherein a portion of the first time period overlaps a portion of the second time period.

22. The circuit of claim 19, wherein the first time period is consecutive with the second time period.

23. The circuit of claim 18, further including an amplitude detection circuit comprising an input coupled for receiving the digital pattern of the optical signal and an output coupled to the input of the first counter.

\* \* \* \* \*